(12) United States Patent
Hwang et al.

(10) Patent No.: US 6,179,046 B1
(45) Date of Patent: Jan. 30, 2001

(54) HEAT DISSIPATION DEVICE

(75) Inventors: Jen-Dong Hwang, Hsinchu; Chen-Jow Wong, Chiai Hsien; Chih-Chao Yang, Tainan, all of (TW)

(73) Assignee: Industrial Technology Research Institute, Hsinchu (TW)

( * ) Notice: Under 35 U.S.C. 154(b), the term of this patent shall be extended for 0 days.

(21) Appl. No.: 09/418,633

(22) Filed: Oct. 15, 1999

(30) Foreign Application Priority Data

Aug. 3, 1999 (TW) .................................................. 88213062

(51) Int. Cl.⁷ ........................................................ H05K 7/20
(52) U.S. Cl. ............................ 165/80.3; 165/121; 361/697
(58) Field of Search .................... 165/80.3, 121, 165/122; 361/697, 704

(56) References Cited

U.S. PATENT DOCUMENTS

| 4,733,293 | * | 3/1988 | Gabuzda | 165/80.3 |
| 5,740,013 | * | 4/1998 | Roesner et al. | 361/697 |
| 5,867,365 | * | 6/1997 | Chiou | 361/690 |
| 5,927,385 | * | 1/1998 | Yeh | 165/80.3 |
| 5,947,192 | * | 8/1998 | Kuo | 165/80.3 |

* cited by examiner

*Primary Examiner*—Allen Flanigan
(74) *Attorney, Agent, or Firm*—Christensen O'Connor Johnson Kindness PLLC

(57) ABSTRACT

A heat dissipation device with an optimal fin arrangement for cooling a CPU. The optimal angle, height, width, and shape of the fins provide superior heat dissipation. The heat dissipation device can be combined with a fan device to form a heat dissipating unit.

18 Claims, 8 Drawing Sheets

HEAT DISSIPATION DEVICE

BACKGROUND OF THE INVENTION

1. Field of the Invention

The present invention relates to a heat dissipation device with an optimal fin arrangement. More particularly, this invention relates to a heat dissipation device with an optimal fin arrangement for cooling a CPU.

2. Description of the Related Art

Heat dissipation is an important factor in the performance of a central processing unit (CPU). The trend towards increased processor speed has led to an increase in the power dissipation by a CPU. For example, the [power dissipation of a Pentium II is up to 43 W.

FIG. 6 depicts a conventional heat sink, comprising a finned plate 1 and a board member 2 mounted onto the finned plate 1. The finned plate 1 is made of materials having heat dissipation characteristics, such as aluminum. The finned plate 1 includes a plurality of rows and/or columns of fins 11 extending upwardly from an upper side of the finned plate 1, wherein gaps 12 are formed among every adjacent fins 11 for the purpose of air convection, and two separable grooves 13 are defined among every adjacent fin block 15. The board member 2 includes a hole 21 defined in an appropriate portion thereof, and a support member 23 provided in the hole 21 and connected to the periphery defining the hole 21 by a plurality of ribs 22 extending to the support member 23. A stud 24 is formed on an upper side of the support member 23 and includes a second hole (not labeled) defined therein for rotationally receiving a rotor shaft of the fan 25.

The finned plate of this heat sink forms a larger heat transfer surface to dissipate heat from the CPU. However, as he heat generated by a CPU increases with advances in processor technology, this dissipation must be optimized.

SUMMARY OF THE INVENTION

It is therefore an object of the present invention to provide a heat dissipation device with an optimal fin arrangement for cooling a CPU.

The heat dissipation device with an optimal fin arrangement of this invention comprises a base plate having an upper surface, a first axis, a second axis, and a circular central portion defining a circumference; a plurality of first fins emanating from the upper surface, the first fins being radially arranged around the circumference, wherein a number of the first fins extending substantially in the direction of the first axis terminate before the edge of the base plate, these number of first fins defining directional vectors; a plurality of second fins emanating from the upper surface of the plate, wherein the second fins are separated from the number of first fins by a first gap, and are formed substantially parallel to and on either side of the directional vectors; and a plurality of third fins emanating from the upper surface of the plate, wherein each of the third fins are formed two adjacent second fins and substantially on the directional vectors, and are separated from the first fins by a second gap larger than the first gap.

The first fins are preferably substantially wedge shaped, and the ratio of the breadth of the gap between successive first fins and the thickness of the first fins ranges from 1.2 and 2 at the circumference. The directional vector of each first fin preferably deviates 18° to 30° from a radial line of the circular central portion, the angle of deviation being measured at the intersection of the radial line and the circumference, and the first fins extending substantially in the direction of the second axis terminate at the edge of the base plate. The second fins emanate a further distance from the upper surface than the first fins, while the third fins emanate a lesser distance from the upper surface than the first fins. The base plate and fins are preferably formed by aluminum die casting.

A board member and fan can be installed on the heat dissipation device of this invention to form a heat dissipation unit. The optimal arrangement of fins on the base plate offers superior dissipation of heat generated by a CPU.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 1A:
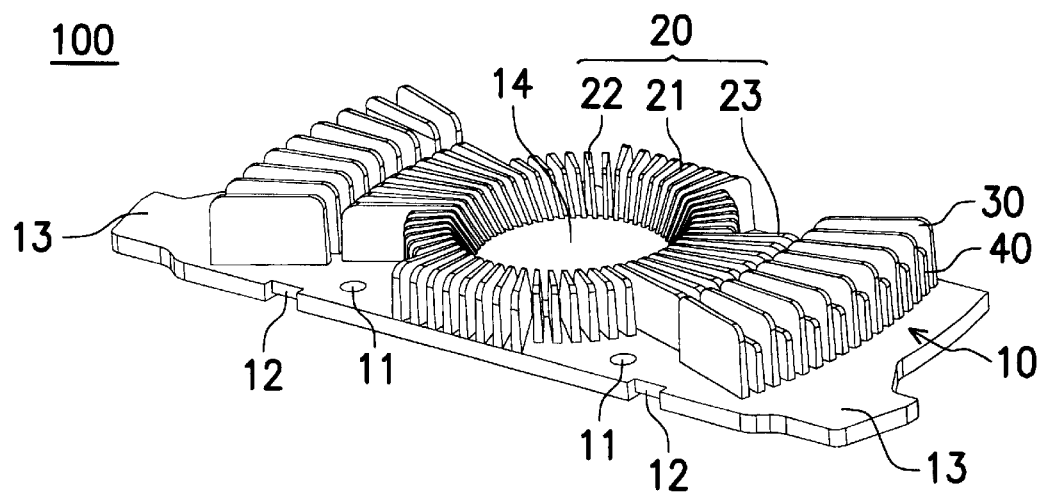
FIGS. 1a to 1f illustrate the heat dissipation device of this invention.
Figure 1B:
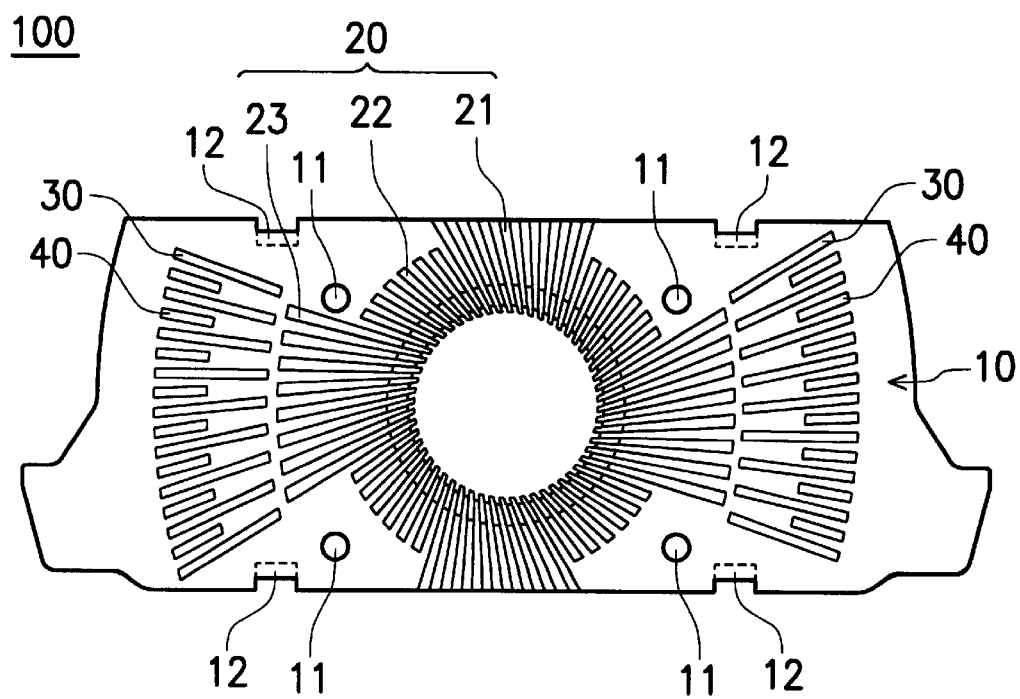
Figure 1D:
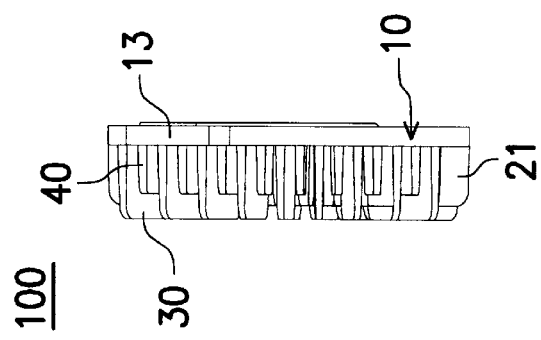
Figure 1C:
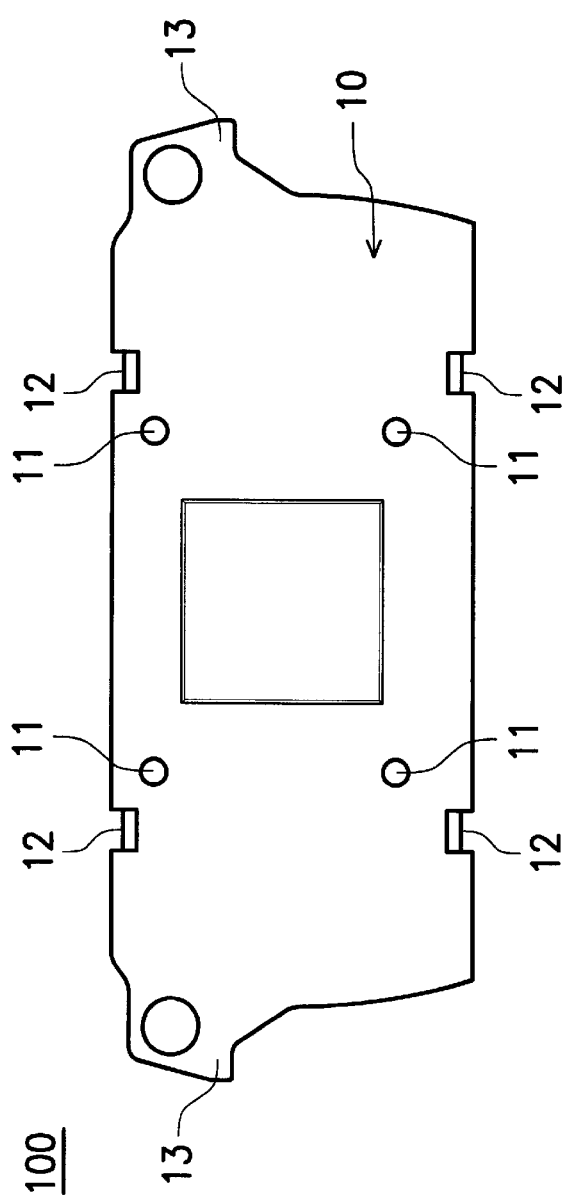
Figure 1E:
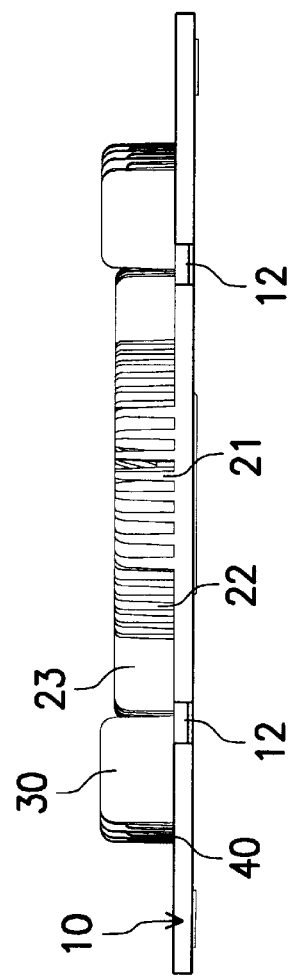

Please refer to FIG. 1a, which illustrates an embodiment of the heat dissipation device with optimal fin arrangement of this invention. A heat dissipation device 100 is provided with a base plate 10 with a plurality of first fins 20, second fins 30, and third fins 40 extending upward therefrom. The first fins 20 comprise three distinct categories, all of which radiate from central portion 14, which is circular in shape. As illustrated in FIG. 1b, the first fins 21 extend to and terminate at the side edges of the base plate 10; the first fins 22 extend a shorter distance and terminate before the edge of the base plate 10, leaving space for mounting holes 11; and first fins 23 generally extend along the longitudinal axis of the base plate 10, terminating before the longitudinal edges.

Figure 2:
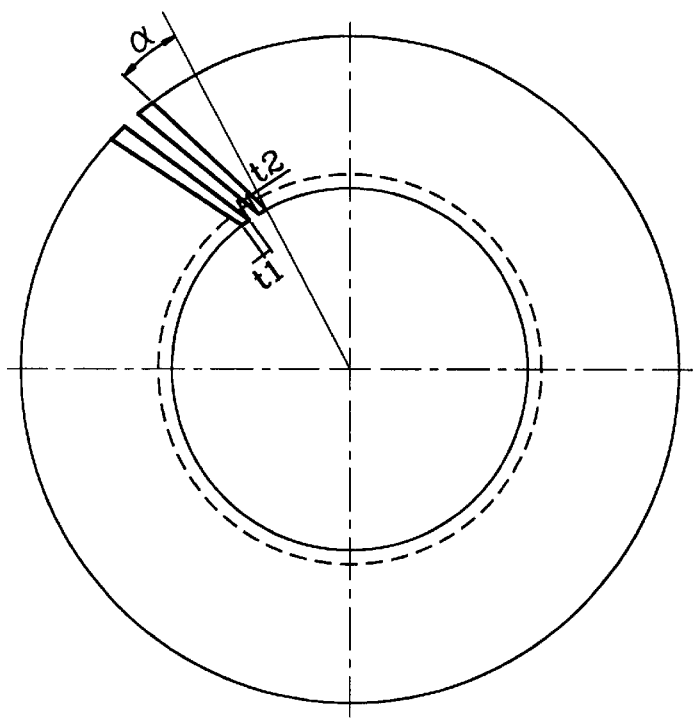
FIG. 2 illustrates the preferred angle of the first fins.

An important aspect of the arrangement of the first fins 20 is their angle. As illustrated in FIG. 2, the first fins 20 are arranged such that an angle of deviation a is formed between an imaginary radial line from the center of the central portion 14 and the directional vector of the fin, wherein the angle is measured at the circumference of the central portion 14 and preferably ranges between 18° and 30°.

A second important aspect of the arrangement of the first fins 20 is that the ratio of the breadth of the gap between successive fins $t_1$ and the thickness of the fin at the circumference of the central portion 14 $t_2$ ranges between 1.2 and 2. Preferably, the fins are substantially wedge shaped, with the small end at the circumference of the central portion 14.

Figure 1F:
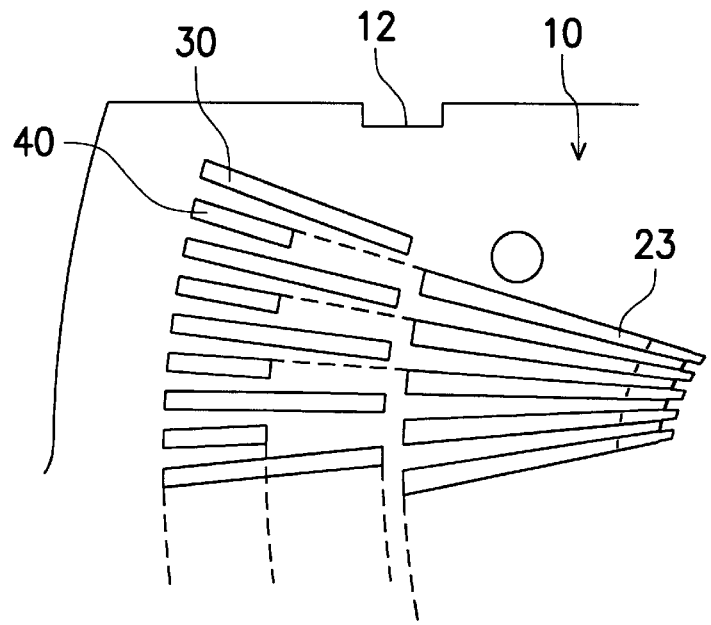

Referring to FIGS. 1b and 1f, the arrangement of the second fins 30 will be described. The second fins 30 are formed substantially parallel to and on either side of the direction vectors of first fins 23, wherein a first gap is left between the termination of the first fins 23 and the beginning of second fins 30. This gap is preferably arc shaped, as illustrated.

Referring again to FIGS. 1b and 1f, the arrangement of the third fins 40 will be described. The third fins 40 are formed substantally on the directional vectors of first fins 23, wherein a second gap larger than the first gap is left between the termination of the first fins 23 and the beginning of third fins 40. This gap is also preferably arc shaped, as illustrated.

Another important aspect of the arrangement of the fins in this invention is their relative height. Referring back to FIG. 1b, please note that first fins 20 extend further from base plate 10 than third fins 40, and extend a lesser distance from the base plate 10 than second fins 30.

The base plate 10 can be provided with protrusions 13 for allowing a user to properly and conveniently ascertain the proper direction for assembly. These protrusions can be used to handle the device during the assembly operation.

The heat dissipation device 100, including the base plate and fins, can be formed, for example, by aluminum die casting.

Figure 3A:
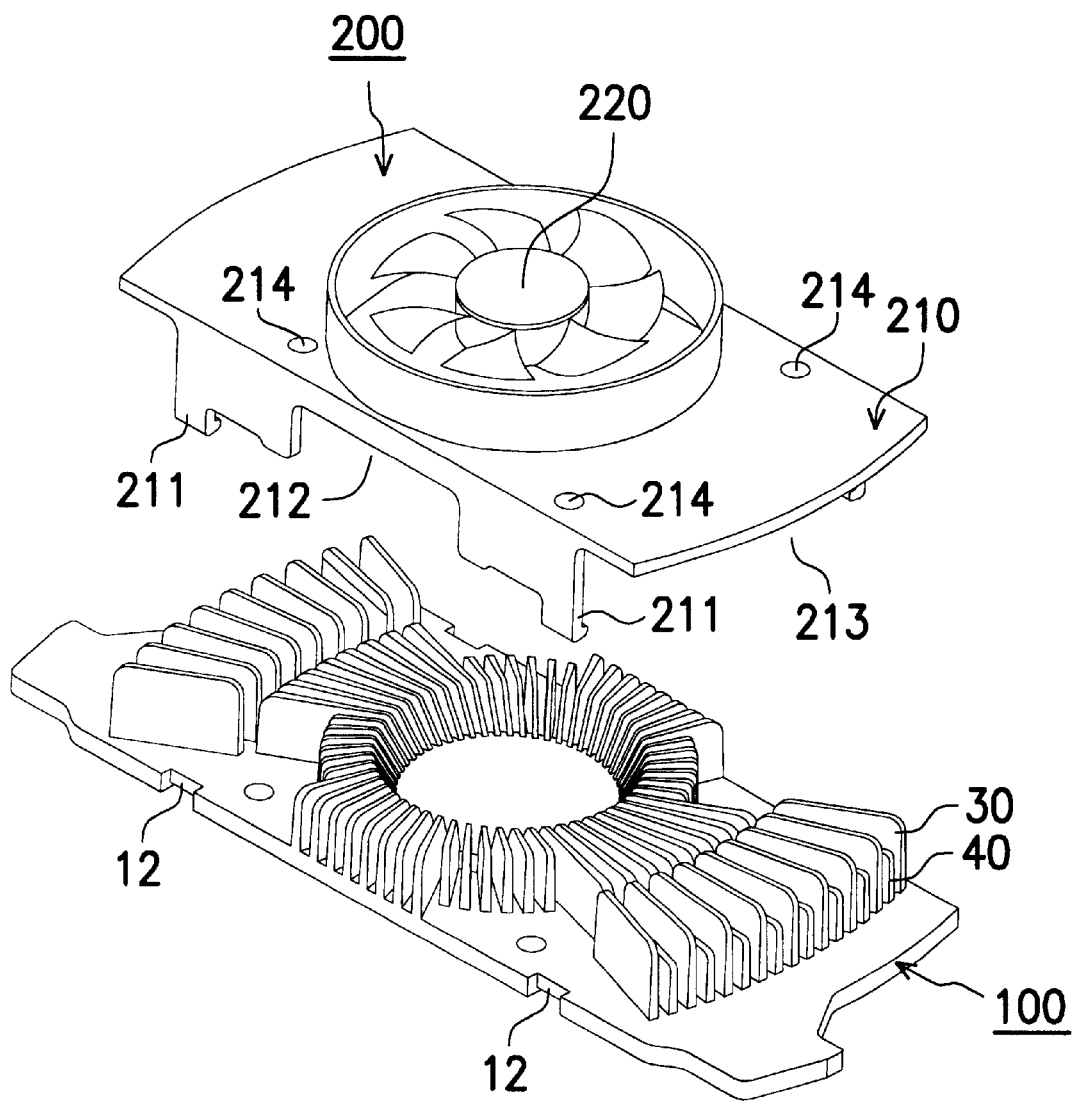
FIGS. 3a and 3b show an exploded and assembled perspective view of the heat dissipation unit of this invention.
Figure 3B:
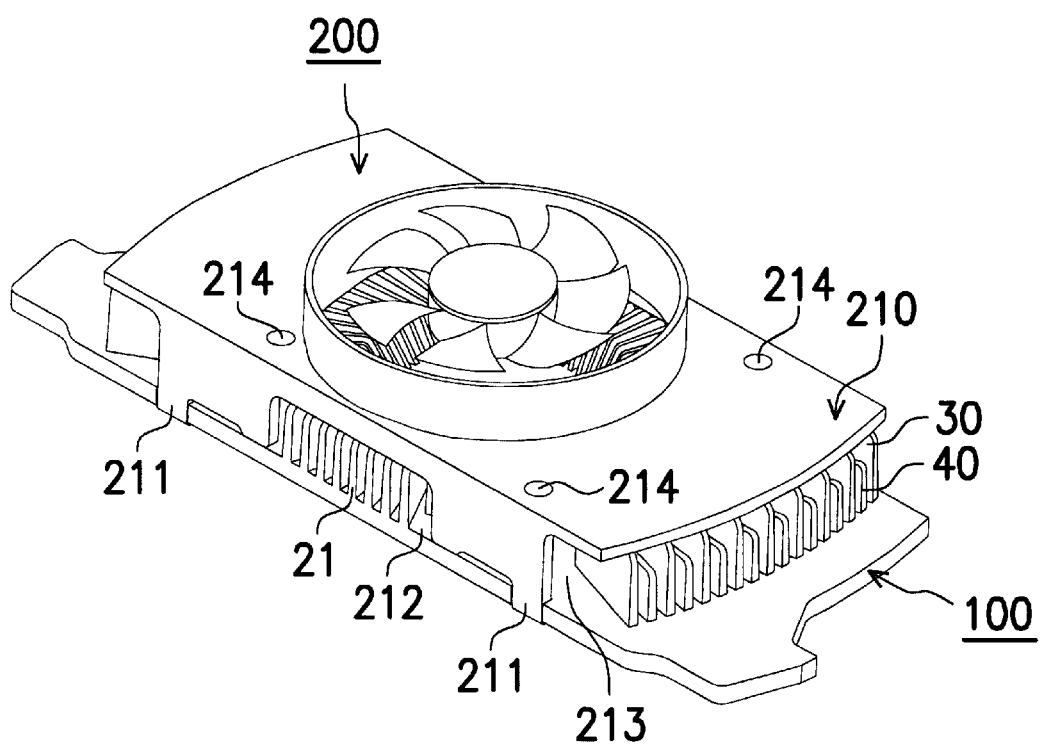

In a second embodiment of the present invention, the heat dissipation device 100 is assembled to a fan device 200 to form a heat dissipating unit. As illustrated in FIG. 3a, a fan device 200 comprises a board member 210, a fan 220 mounted in a hole formed through board 210, mounting holes 214, and hook protrusions 211. Hook protrusions 211 allow the secure assembly of the fan device 200 to recesses 12 formed in the heat dissipation device 100, wherein the fan 220 is positioned directly over the central portion 14. The assembled of the heat dissipation unit is shown in FIG. 3b.

Yet another important aspect of this invention is the openness of the side portions of the heat dissipation device 100 and the fan device 200. As can be seen in FIGS. 3a and 3b, open side portions 212 and 213 of the board member 210 allow the terminating ends of the first, second and third fins to communicate with the ambient. This improves the convection of air within the heat dissipation unit.

Figure 4:
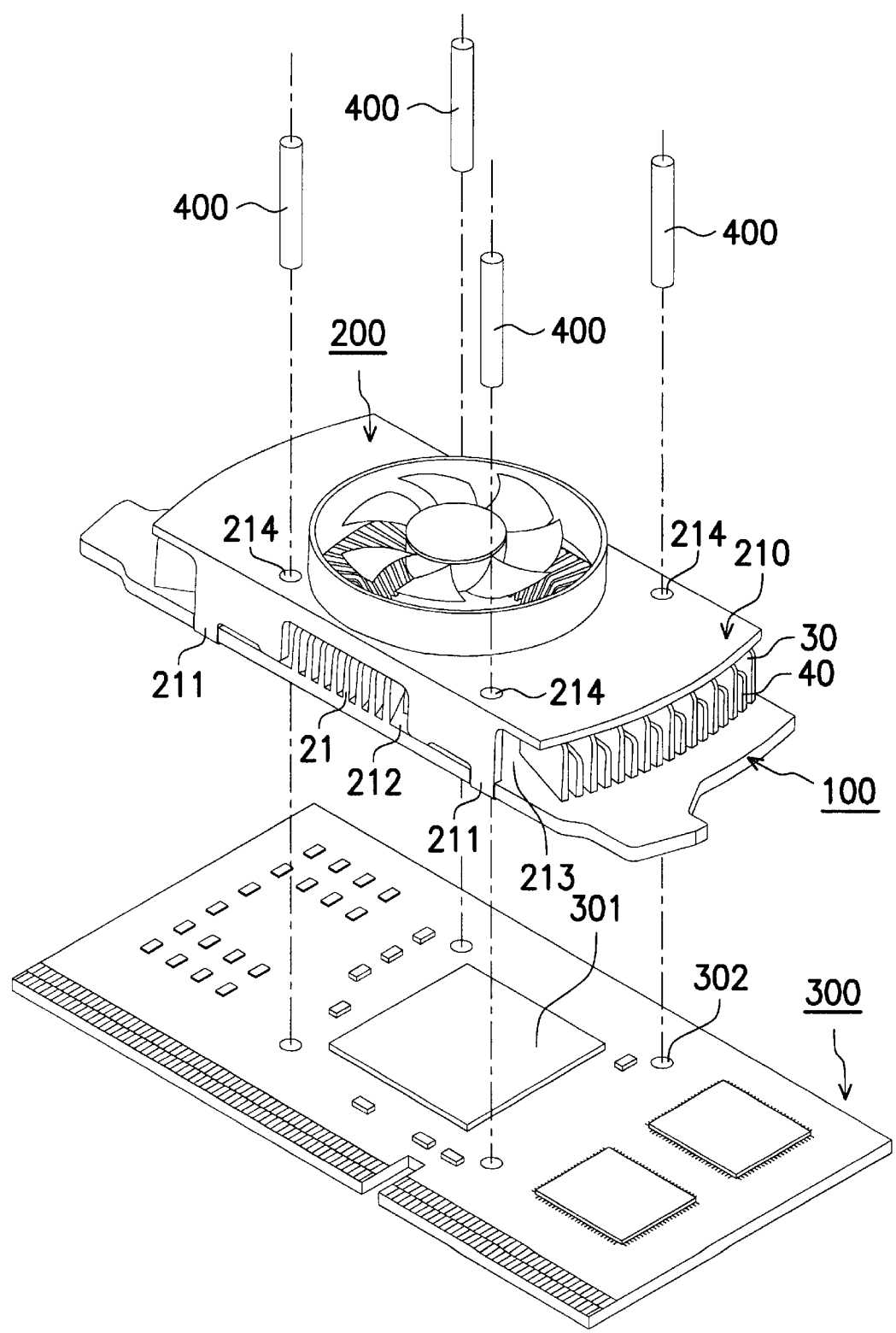
FIG. 4 is a perspective view of the assembled heat dissipation unit of this invention and a circuit board.

FIG. 4 illustrates the assembly of the heat dissipation unit to a circuit board 300. Mounting rods 400 are inserted through mounting holes 214 of the fan device 200 and mounting holes 11 of the heat dissipation device 100 and into receiving holes 302. Please note that CPU 301 is located directly under central portion 14 of the heat dissipation device 100.

Figure 5:
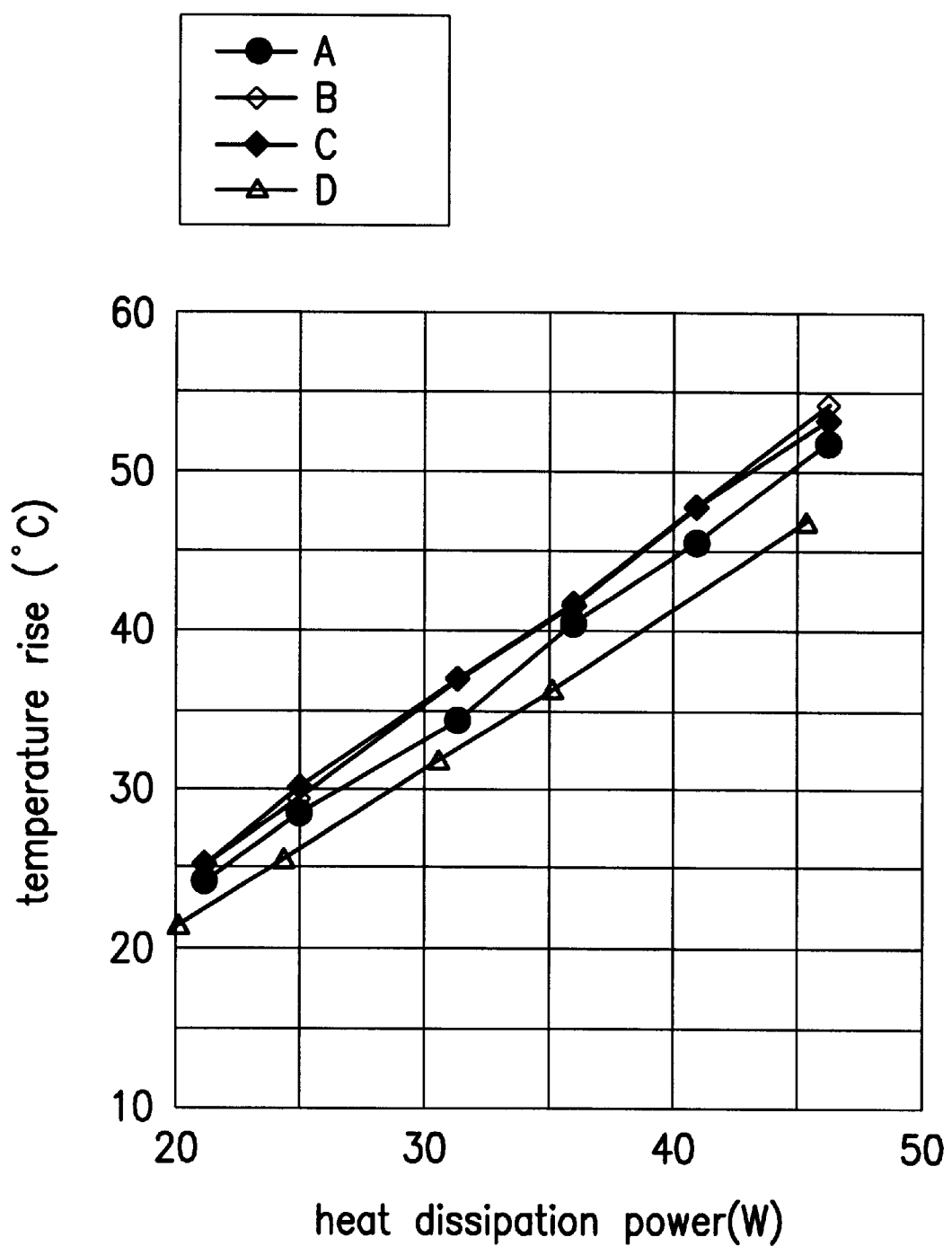
FIG. 5 is a chart illustrating the effectiveness of the heat dissipation device of this invention.
Figure 6:
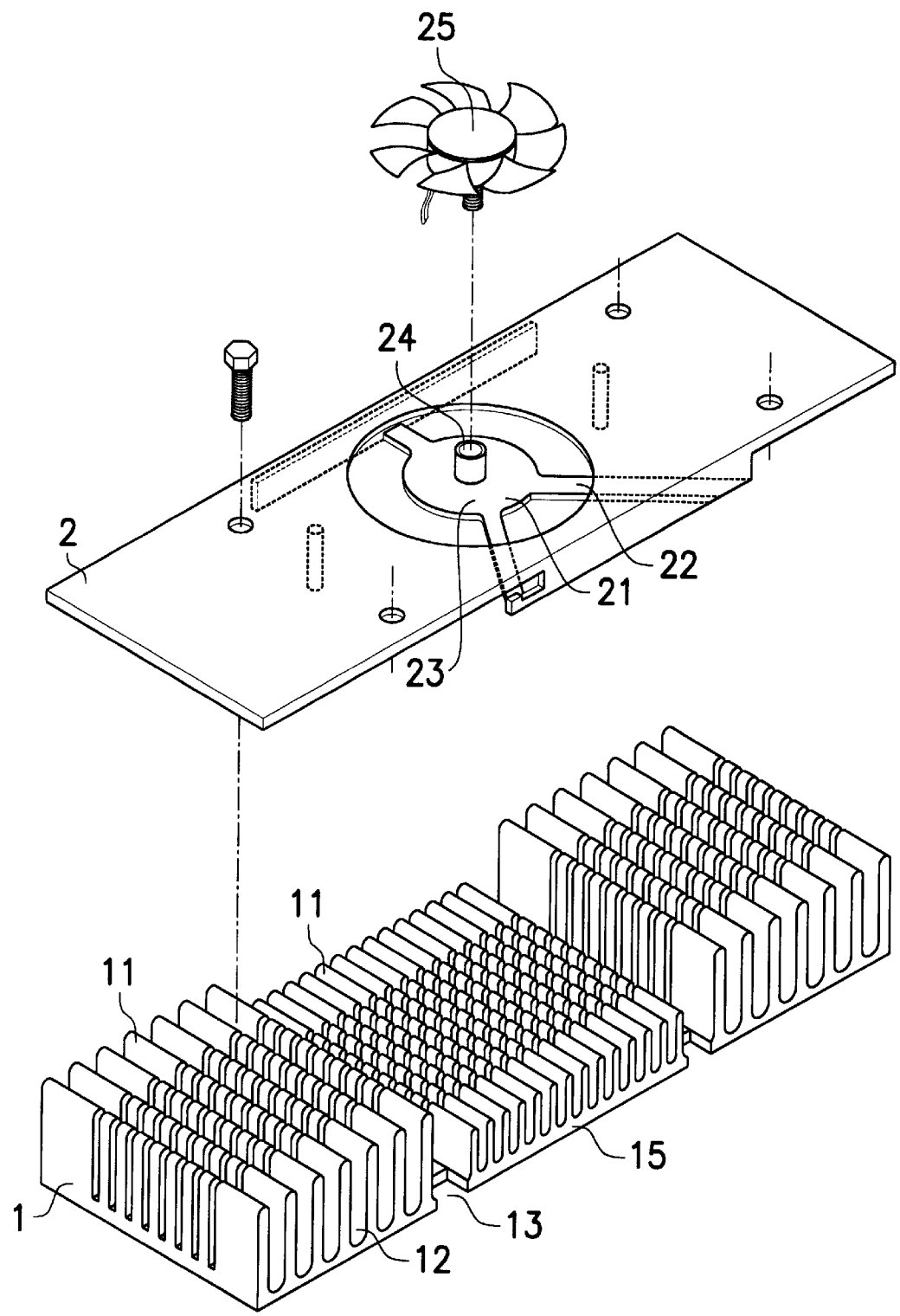
FIG. 6 is an exploded perspective view of the heat dissipation device of the prior art.

FIG. 5 is a chart showing the effectiveness of the present invention in dissipating the heat. In the chart, the lines indicate the relationship between temperature change and wattage as measured on a test heater installed with various heat dissipation units, wherein lines A through C show the results for heat dissipation units with heat dissipating devices of the prior art, while line D shows the results for a heat dissipation unit with a heat dissipating device of the present invention. Note that the heat dissipating device tested in line A was fabricated by aluminum extrusion and weighed 126 g, while those tested in lines B through D were fabricated by aluminum die casting and weighed 96, 108 g, and 80 g, respectively. As shown in this chart, the temperature is kept significantly lower by the heat dissipation device of the present invention. Furthermore, the heat dissipation device is lighter. Therefore, this invention achieves superior heat dissipation more efficiently than in the prior art.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A heat dissipation device with optimal fin arrangement comprising:
   a base plate having an upper surface, a first axis, a second axis, and a circular central portion defining a circumference;
   a plurality of first fins emanating from the upper surface, the first fins being radially arranged around the circumference, wherein a number of the first fins extending substantially in the direction of the first axis terminate before the edge of the base plate, these number of first fins defining directional vectors;
   a plurality of second fins emanating from the upper surface of the plate, wherein the second fins are separated from the number of first fins by a first gap, and are formed substantially parallel to and on either side of the directional vectors; and
   a plurality of third fins emanating from the upper surface of the plate, wherein each of the third fins are formed between two adjacent second fins and substantially on the directional vectors, and are separated from the first fins by a second gap larger than the first gap.

2. The heat dissipation device with optimal fin arrangement as claimed in claim 1, wherein the first fins are substantially wedge shaped.

3. The heat dissipation device with optimal fin arrangement as claimed in claim 1, wherein the ratio of the breadth of the gap between successive first fins and the thickness of the first fins ranges from 1.2 and 2 at the circumference.

4. The heat dissipation device with optimal fin arrangement as claimed in claim 1, wherein the directional vector of each first fin deviates 18° to 30° from a radial line of the circular central portion, the angle of deviation being measured at the intersection of the radial line and the circumference.

5. The heat dissipation device with optimal fin arrangement as claimed in claim 1, wherein the first fins extending substantially in the direction of the second axis terminate at the edge of the base plate.

6. The heat dissipation device with optimal fin arrangement as claimed in claim 1, wherein the second fins emanate a further distance from the upper surface than the first fins.

7. The heat dissipation device with optimal fin arrangement as claimed in claim 1, wherein the third fins emanate a lesser distance from the upper surface than the first fins.

8. The heat dissipation device with optimal fin arrangement as claimed in claim 1, wherein the base plate and fins are formed by aluminum die casting.

9. A heat dissipation unit comprising:
   a base plate having an upper surface, a first axis, a second axis, and a circular central portion defining a circumference;
   at least one first connecting means disposed on the base plate;
   a plurality of first fins emanating from the upper surface, the first fins being radially arranged around the circumference, wherein a number of the first fins extending substantially in the direction of the first axis terminate before the edge of the base plate, these number of first fins defining directional vectors;
   a plurality of second fins emanating from the upper surface of the plate, wherein the second fins are separated from the number of first fins by a first gap, and are formed substantially parallel to and on either side of the directional vectors;

a plurality of third fins emanating from the upper surface of the plate, wherein each of the third fins are formed between two adjacent second fins and substantially on the directional vectors, and are separated from the first fins by a second gap larger than the first gap, a board member with a fan opening formed there through;

at least one second connecting means disposed on the board member; and a fan disposed in the fan opening;

wherein, the base plate and the board member are connected by the first connecting means and the second connecting means such that the fan opening is positioned over the central portion of the base plate.

10. The heat dissipation unit as claimed in claim 9, wherein the first fins are substantially wedge shaped.

11. The heat dissipation unit as claimed in claim 10, wherein the ratio of the breadth of the gap between successive first fins and the thickness of the first fins ranges from 1.2 and 2 at the circumference.

12. The heat dissipation unit as claimed in claim 10, wherein the directional vector of each first fin deviates 18° to 30° from a radial line of the circular central portion, the angle of deviation being measured at the intersection of the radial line and the circumference.

13. The heat dissipation unit as claimed in claim 10, wherein the first fins extending substantially in the direction of the second axis terminate at the edge of the base plate.

14. The heat dissipation unit as claimed in claim 10, wherein the second fins emanate a further distance from the upper surface than the first fins.

15. The heat dissipation unit as claimed in claim 10, wherein the third fins emanate a lesser distance from the upper surface than the first fins.

16. The heat dissipation unit as claimed in claim 10, wherein the base plate and fins are formed by aluminum die casting.

17. The heat dissipation unit as claimed in claim 10, wherein the first connecting means includes a recess formed in the base plate and the second connecting means includes a hook extending downward from the board member, the hook being received by the recess to form a secure connection.

18. The heat dissipation unit as claimed in claim 10, wherein a plurality of corresponding mounting holes are provided on the base plate and the board member for mounting the heat dissipation unit to a circuit board.

* * * * *